United States Patent
Fish

(10) Patent No.: US 12,213,379 B2
(45) Date of Patent: *Jan. 28, 2025

(54) THERMOELECTRICALLY ACTUATED PHASE CHANGE THERMAL ENERGY STORAGE (TES) MODULE

(71) Applicant: U.S. Army DEVCOM, Army Research Laboratory, Adelphi, MD (US)

(72) Inventor: Michael C. Fish, Arlington, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/116,873

(22) Filed: Mar. 3, 2023

(65) Prior Publication Data
US 2023/0210008 A1    Jun. 29, 2023

Related U.S. Application Data

(62) Division of application No. 17/546,246, filed on Dec. 9, 2021.

(60) Provisional application No. 63/189,382, filed on May 17, 2021.

(51) Int. Cl.
*H10N 10/13* (2023.01)
*H10N 10/17* (2023.01)

(52) U.S. Cl.
CPC ............. *H10N 10/13* (2023.02); *H10N 10/17* (2023.02)

(58) Field of Classification Search
None
See application file for complete search history.

(56) References Cited

U.S. PATENT DOCUMENTS

| | | | |
|---|---|---|---|
| 4,109,702 A | 8/1978 | Greene | |
| 6,307,871 B1 * | 10/2001 | Heberle | H01S 3/042 372/36 |
| 2005/0045702 A1 * | 3/2005 | Freeman | B23K 31/02 228/180.21 |

OTHER PUBLICATIONS

Su, Weiguang et al., "Review of solid-liquid phase change materials and their encapsulation technologies", Renewable and Sustainable Energy Reviews 48, pp. 373-391. (Year: 2015).*

(Continued)

*Primary Examiner* — Tamir Ayad
(74) *Attorney, Agent, or Firm* — Emily C. Moscati

(57) ABSTRACT

A thermal energy storage (TES) device includes a thermoelectric cooler; and a metallic phase change material (PCM) within the thermoelectric cooler. The PCM may include any of gallium or its alloys, low temperature fusible alloys, and solid metal shape memory alloys. A thermoelectric effect within the PCM is to transport heat in the thermoelectric cooler. The TES device may include a graded oxide layer adjacent to the PCM to serve as a distributed electrical junction in the thermoelectric cooler to create a hot side thermoelectric junction in a bulk volume of the PCM. The graded oxide layer may include α-IGZO. The TES device may include a high-thermopower corrugated metal foil layer comprising barrier oxides patterned therein. The high-thermopower metal foil layer may be adjacent to the graded oxide layer. The TES device may include a dielectric layer adjacent to the high-thermopower corrugated metal foil layer.

8 Claims, 7 Drawing Sheets

(56) References Cited

OTHER PUBLICATIONS

Owoyele, O., et al., "Performance analysis of a thermoelectric cooler with a corrugated architecture," Applied Energy, vol. 147, Issue C, Jun. 2015, pp. 184-191.
Adams, M., et al., "Active Peltier Coolers Based on Correlated and Magnon-Drag Metals," Phys. Rev., Applied, vol. 11, Issue 5, May 3, 2019, pp. 054008-1 to 054008-6.

* cited by examiner

THERMOELECTRICALLY ACTUATED PHASE CHANGE THERMAL ENERGY STORAGE (TES) MODULE

CROSS-REFERENCE TO RELATED APPLICATION

This application is a divisional of U.S. patent application Ser. No. 17,546,246, filed Dec. 9, 2021, the complete disclosure of which, in its entirety, is herein incorporated by reference for all purposes.

GOVERNMENT INTEREST

The embodiments herein may be manufactured, used, and/or licensed by or for the United States Government without the payment of royalties thereon.

TECHNICAL FIELD

The embodiments herein generally relate to thermal buffering techniques, and more particularly to thermal buffering in thermal energy storage systems.

DESCRIPTION OF THE RELATED ART

Phase-change materials (PCMs) have been widely investigated for their potential application in transiently driven electronic systems. One of the challenges in using PCMs becomes limitations in coupling energy into or out of the thermal energy storage (TES) in a timely fashion. Just as liquid-vapor systems must contend with critical heat flux, so too must a static phase change system present sufficient power storage density for the application at hand. For low conductivity PCMs (paraffin waxes, sugar alcohols, salt hydrates) this is often accomplished using conductivity enhancements such as particulate additives, conductive fins, or expanded metal foams. An alternative is to use low melting point metals (LMPM) and alloys, which have higher intrinsic conductivity and comparable volumetric energy storage density. However, even conductivity enhanced LMPM composites will reach a limit to power storage density, leaving very high flux applications un-addressable using a low form-factor, passive solution.

Conventional techniques use physical phase transformations to accomplish TES for one application or another. These range from the strategic release of that energy at a more favorable time as in TES building materials for use under diurnal cycles to the simple case of an ice bath maintaining a constant temperature in the face of an elevated ambient environment. A common theme in PCM-based TMS is the need for sufficient storage density in terms of both power and energy for the application at hand. Energy storage density is simply the per-mass (specific) or per-volume (volumetric) energy stored during phase change (and system temperature changes if sensible heating is a non-negligible component of storage). Storage power density is related to ability to quickly couple energy into and out of the system, i.e., to charge and discharge the buffering component. Industry experts have proposed a material figure of merit, $\eta_q$, to assess storage power density, which serves as the proportionality constant for semi-infinite 1D heating due to a constant temperature boundary:

$$\frac{q''}{\Delta T} = \frac{\eta_q}{\sqrt{\pi t}} \quad (1)$$

where $\Delta T$ is the step change from uniform initial temperature to the change of the boundary. For a non-PCM material, $\eta_q$ reduces to the textbook quantity of $\sqrt{k \cdot (\rho C_p)}$. For a PCM with transition temperature just above the initial temperature, and for small $\Delta T$, $$\eta_q = \frac{\sqrt{k_l \cdot (\rho H_\Delta)}}{0.775\sqrt{\Delta T}} \quad (2)$$

As a proxy for power density, the effective $\eta_q$ for a system is often a sought after target for enhancement.

These two needs—power versus energy—frequently exist in tension with one another and also with the overarching SWAP-C objectives. For example, paraffins have very attractive specific energy density, but owing its poor thermal conductivity, for many applications paraffin-based systems require significant conduction enhancement to achieve adequate power density. Metallic fin structures, heat pipes, and additives and other remedies for increasing power density necessarily impact the system energy density as well as SWAP-C.

Between these various PCM-based systems, one unifying phenomenon is that at its core the phase change process proceeds through conduction through the transformed phase (e.g., the liquid phase during melting). Passive conductivity enhancements may increase this effective conductivity, but when optimized to create an effectively homogeneous composite there is still a progression of a planar transformation front in a direction normal to heat flux from the active boundary condition. The conceptual paradigm of fin structures providing surface area enhancement (in the vein of convective cooling) becomes here a fiction only useful in a poorly optimized composite. The convoluted phase front resulting from coarse fin pitch is accompanied by significant resistances in the PCM and a lower storage power density.

This inescapability of conduction transport leads to the difficulty in reconciling the two storage metrics of a TES system. Energy storage is a bulk concept, while power density is linked to an interface area. Relying on a phase front to sweep out the volume of the bulk will place physical material limits on power density. Breaking the dominance of conduction would require movement of the PCM (requiring recourse to the entire field of two-phase convective heat transfer) or spatially grading the transition temperature of the PCM so it transitions all at once (necessarily fine-tuning to the application and requiring a warm-up period to establish the temperature field).

SUMMARY

In view of the foregoing, an embodiment herein provides a thermal energy storage (TES) device comprising a thermoelectric cooler; and a metallic phase change material (PCM) within the thermoelectric cooler. The PCM may comprise any of gallium or its alloys, low temperature fusible alloys, and solid metal shape memory alloys. A thermoelectric effect within the PCM is to transport heat in the thermoelectric cooler. The TES device may comprise a graded oxide layer adjacent to the PCM to serve as a distributed electrical junction in the thermoelectric cooler to create a hot side thermoelectric junction in a bulk volume of the PCM. The graded oxide layer may comprise α-IGZO. The TES device may comprise a high-thermopower corrugated metal foil layer comprising barrier oxides patterned therein. The high-thermopower corrugated metal foil layer may be adjacent to the graded oxide layer. The TES device may comprise a dielectric layer adjacent to the high-thermopower corrugated metal foil layer.

Another embodiment provides a TES system comprising a Peltier device comprising a cold side thermoelectric junction that transports heat to a hot side thermoelectric junction; and a low melting point metal (LMPM) material within the Peltier device, wherein the LMPM material is to (i) temporarily store transported heat in the hot side thermoelectric junction, and (ii) control a thermal release of the heat at a selected time. A thermoelectric effect of the LMPM material is to transport heat in the Peltier device. The LMPM material may comprise a metallic PCM. The LMPM material may comprise any of gallium or its alloys, low temperature fusible alloys, and solid metal shape memory alloys.

The TES system may comprise a graded oxide layer adjacent to the LMPM material to serve as a distributed electrical junction to create the hot side thermoelectric junction in a bulk volume of the LMPM material. The graded oxide layer may comprise α-IGZO. The TES system may comprise a high-thermopower corrugated metal foil layer comprising barrier oxides patterned therein. The high-thermopower corrugated metal foil layer may be adjacent to the graded oxide layer. The TES system may comprise a dielectric layer adjacent to the high-thermopower corrugated metal foil layer. The high-thermopower corrugated metal foil layer may comprise copper. The dielectric layer may comprise SiN. The Peltier device may comprise a baseplate adjacent to the cold side thermoelectric junction. The Peltier device may comprise an insulation encapsulating layer adjacent to the hot side thermoelectric junction. The insulation encapsulating layer may comprise a ceramic material.

These and other aspects of the embodiments herein will be better appreciated and understood when considered in conjunction with the following description and the accompanying drawings. It should be understood, however, that the following descriptions, while indicating exemplary embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

Figure 1:
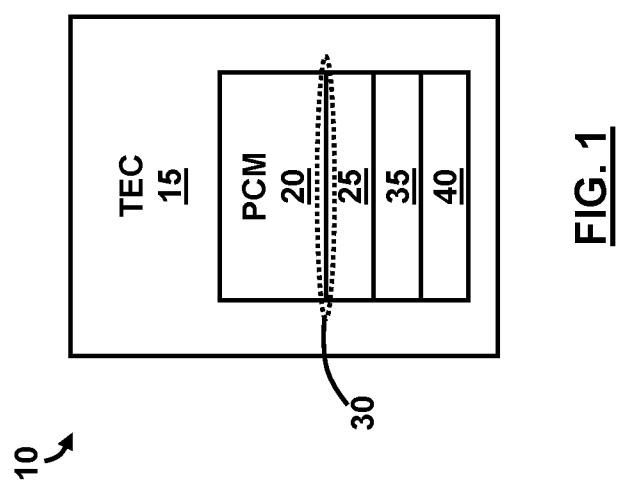
FIG. 1 is a block diagram illustrating a thermal energy storage (TES) device, according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as not to unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Definitions—The following nomenclature is used throughout the description below:
$C_p$—specific heat, J/kg-K
COP—coefficient of performance
F—non-dimensional voltage
H—latent heat of phase transformation, J/kg
$h_v$—volumetric latent heat of transformation, J/m3
J—non-dimensional current density
j—current density, A/m$^3$
k—thermal conductivity, W/m-K
L—length of distributed junction, m
M—shape/efficiency factor
N—number of couples
P—interior power dissipation/transport, W/m$^2$
q"—energy storage boundary heat flux, W/m$^2$
R—resistance, Ω
S—Seebeck coefficient, V/K
T—temperature, K
t—time, s
V—voltage, V
W'—device power consumption, W/m
w—width (perpendicular to x), m
x—distance from junction terminus, m
Z—thermoelectric figure of merit, 1/K
Greek Symbols:
α—resistivity ratio
ζ—non-dimensional distance from junction terminus
$\eta_q$—thermal energy storage figure of merit, s$^{1/2}$-W/m$^2$-K
ρ—electrical resistivity, Ω-m
(ρ*)—density (when with a thermal parameter), kg/m$^3$
σ—electrical conductivity, A/V-m
φ—PCM fill factor
Subscripts:
0—at junction terminus
1—couple material 1 (cobalt)
2—couple material 2 (gallium)
bd—isothermal boundary temperature
c—charging
f—variable resistivity oxide film (α-IGZO)
i—initial
l—liquid (PCM)
min—minimal s—solid (PCM)
t—total TECs using metallic elements do not exist commercially because they are not viable for typical applications (pumping heat against a gradient, e.g., refrigeration). The integration of a PCM within the structure of a TEC has not been discussed before in the industry. The passive, nonlinear thermal capacitance offered by solid-liquid or solid-solid phase change promises to provide thermal load leveling under dissipation transients. This in turn allows a steady-state thermal management system (TMS) sized to that of the average component power dissipation to be operated at full utilization. The end result is a lower size, weight, power, and cost (SWAP-C) of the aggregate PCM/TMS transient thermal solution. The embodiments herein provide a new way to introduce area advantage to a PCM-based TES. By leveraging the Peltier effect—responsible for thermoelectric cooling—in a novel way, a true area-to-volume coupling can be made in a self-contained, static TES that does not rely on external system gradients to drive heat transfer. Referring now to the drawings, and more particularly to FIGS. 1 through 7, where similar reference characters denote corresponding features consistently throughout the figures, there are shown preferred embodiments. In the drawings, the size and relative sizes of components, layers, and regions, etc. may be exaggerated for clarity.

FIG. 1 illustrates a TES device 10 comprising a thermoelectric cooler (TEC) 15, and a metallic PCM 20 within the TEC 15. TECs or Peltier devices, such as the thermoelectric cooler 15, rely on the junction of dissimilar materials to transport heat. Owing to the differing energy levels of carriers (electrons and holes) of electric current in different materials, when current passes through such a junction heat is either released or absorbed according to:

$$q''=\Delta S T_j \quad (3)$$

where q" is the interfacial generation or absorption of heat, ΔS is the difference in the Seebeck coefficient of the materials, T is the temperature of the junction in K, and j is the current density through the interface.

According to an example, the TEC 15 may be constructed by joining a collection of thermocouples (not shown)—each formed from two elements—together in series electrically. By arranging to have the junctions where ΔS is negative on one plane, and positive on another, a net transport of heat can be induced from the "cold" junction side to the "hot" junction side. Reversing the current reverses the direction of heat transport.

Considerable attention has been paid by the electronic thermal community for the promise of PCMs to provide thermal buffering to electronic systems undergoing transient events. These events could include computational sprints in consumer devices or at individual cores in a multi-core processor, the stochastic loading experienced by a converter in an electric vehicle drive train under realistic road conditions, or the strictly defined loading of a directed energy weapon used for air and missile defense. Encompassed in this variety are wide ranges in target operating temperature, transient profile, device power density, and the suitability of differing types of TMS. As is generally the case, the ultimate objective is to reduce the size, weight, power, and cost (SWAP-C) of the TMS, and a transient-aware solution incorporating PCMs is a promising avenue to achieving improvements over a traditional steady-state solution. Low melting point metals (LMPM) and alloys for near- and on-chip transient mitigation applications may be utilized. The high inherent storage power density of LMPMs (due in large part to high thermal conductivity) makes them attractive for such targeted applications where the drawbacks associated with high cost and density are minimized.

According to some examples, the PCM 20 may comprise any of gallium or its alloys, other low temperature fusible alloys, and solid metal shape memory alloys (e.g., such as nickel titanium, etc.). A thermoelectric effect within the PCM 20 is to transport heat in the thermoelectric cooler 15. The TES device 10 may comprise a graded oxide layer 25 adjacent to the PCM 20 to serve as a distributed electrical junction in the thermoelectric cooler 15 to create a hot side thermoelectric junction 30 in a bulk volume of the PCM 20. In an example, the graded oxide layer 25 may comprise α-IGZO. According to an example, the TES device 10 may comprise a high-thermopower (e.g., copper, etc.) corrugated metal foil layer 35 comprising barrier oxides patterned therein. The high-thermopower corrugated metal foil layer 35 may be adjacent to the graded oxide layer 25. The TES device 10 may comprise a dielectric layer 40 adjacent to the high-thermopower corrugated metal foil layer 35, according to an example.

Historically TECs are used as heat pumps. Electrical work is expended to move heat from cold side to hot side. A component of this work is lost to Joule heating from the electrical resistivity of the materials used. Once the temperature gradient is established, a parasitic heat flow occurs from hot to cold, against the intended pumping direction. These "Fourier losses" can be mitigated by using low thermal conductivity elements. A dimensionless figure of merit that can be applied to TEC materials is:

$$ZT = \frac{S^2 \sigma}{k} T \quad (4)$$

where, again, T is the absolute operating temperature. Desirable materials thus have high thermopower, S, high electrical conductivity, σ, to limit Joule losses, and low thermal conductivity, k, to limit Fourier losses.

As heat pumps, TECs are frequently compared to vapor compression cycles (VCS), where terminology like coefficient of performance and thermal lift are used. The historic analogy continues with thermoelectric generators (TEG) and vapor power cycles reversing the process and converting a temperature gradient into useful work with an efficiency having a theoretical limit dictated by the Carnot efficiency. In order to pump the working fluid in its liquid phase (and reap the corresponding reductions in work input), the condenser of a two-phase pumped loop (TPPL) must be colder than the evaporator. In other words, a TPPL pumps heat "downhill". Any instantiation of a TEC pumping downhill has no reason to focus on ZT as a performance metric.

With the design freedom offered by a variable resistivity junction, actionable design rules must be adopted to constrain the design space enough to embark on a numerical feasibility study. One guiding principle is that the bulk volume of PCM in the TES should participate in thermal storage uniformly throughout the charging cycle. This means that along the direction normal to the cold-side header, the total heat generation should be uniform.

Figure 2:
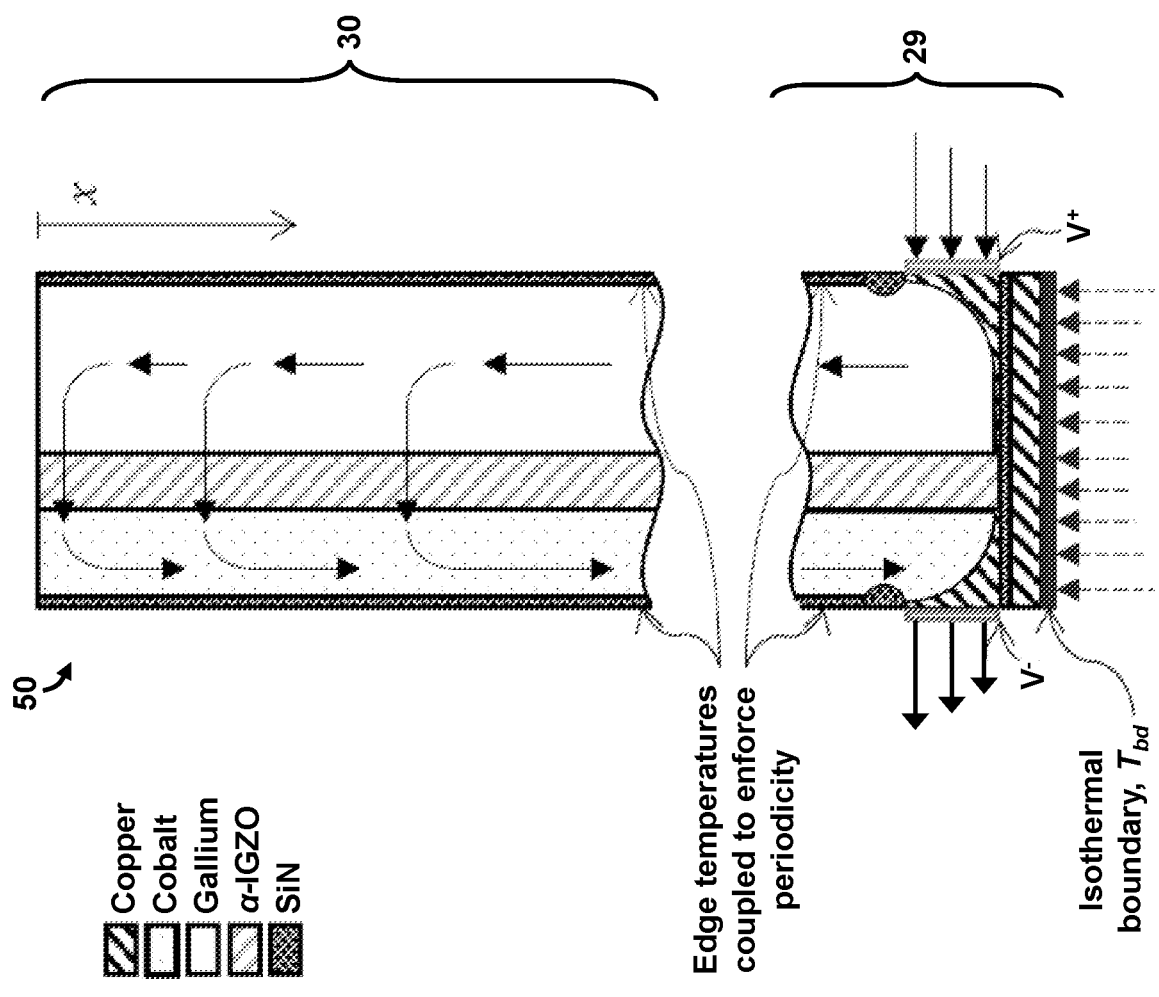
FIG. 2 is schematic diagram illustrating an active Peltier (AP)-TES thermocouple device, according to an embodiment herein.

Along the junction, heat generation occurs as a result of three effects: Peltier heating of the junction, Joule losses at the junction interface, and Joule losses due to current conduction in the two metal elements. A simplifying assumption is that of one-dimensional current flow in the metal elements and across the interface, and uniform temperature. Equation (5) describes this combined dissipation:

$$P(x) = STj_f(x) + j_f^2(x)\rho_f(x)w_f - j_1(x)\frac{dV_1(x)}{dx}w_1 - j_2(x)\frac{dV_2(x)}{dx}w_2 = \text{constant} \quad (5)$$

where subscripts f, 1, and 2 correspond to the junction oxide film, metal 1 (cobalt), and metal 2 (gallium), respectively. For convenience, Δ is dropped from the couple Seebeck differential, and S now refers to the "device" Seebeck coefficient, rather than that of a particular material. Current densities, S, oxide resistivity, $\rho_f$, and element voltages, V are functions of distance from the junction terminus, x, as shown in FIG. 2, with reference to FIG. 1. FIG. 2 illustrates an example AP-TES thermocouple 50 in accordance with an embodiment herein. The distributed hot junction 30 (upper section) and shaped cold junction 29 (lower section) have differing design rationale. Induced current flows are shown in solid arrows, while boundary heat flux is shown in dashed arrows. Not depicted are heat flux reaction "forces" at the lateral boundaries demanded by periodic symmetry. Current in the metal elements is along the length of the thermocouple 50 (parallel to x) while the film current is through the thickness of the film (perpendicular to x). Widths of the three components, $w_i$, are measured in this perpendicular direction.

Equating the derivative of Equation (5) to zero and applying Kirkhoff's Law and Ohm's Law results in a coupled pair of differential equations that are first order in $j_f(x)$ and second order in in $j_f(x)\rho_f(x)w_f$ (the oxide voltage drop, $V_1-V_2$). Non-dimensionalizing and solving this system gives the (non-dimensional) film current density, J, and voltage, F, that satisfy:

$$\int\int Jd\zeta^2 = F = M\left(1+\zeta^2/M\right)^{1/2} - M \quad (6)$$

$$\int Jd\zeta = F' = \zeta\left(1+\zeta^2/M\right)^{-1/2} \quad (7)$$

$$J = F'' = \left(1+\zeta^2/M\right)^{-3/2} \quad (8)$$

where distance is normalized by the junction length, $\zeta \equiv x/L$; $J \equiv j_f/j_0$ is normalized by the terminus current density; and $$F \equiv J \cdot \frac{\rho_f(\zeta)w_f}{RL^2}$$

is normalized by $L^2$ and the "1D couple resistance,"

$$R \equiv \left[\frac{\rho_1}{w_1} + \frac{\rho_2}{w_2}\right].$$

The solution given by Equations (4-6) uses the boundary condition F(0)=0, implying vanishing film resistivity at the terminus.

The interesting feature is that the uniformly dissipating junction design can be characterized by a single scale parameter:

$$M = \frac{ST}{j_0 RL^2} \quad (9)$$

This parameter is a measure of the ideality of the junction, with M→∞ representing an ideal junction where Joule losses vanish in comparison to the Peltier transport. In that scenario, the junction current density is constant (yielding uniform Peltier dissipation) and the film resistivity is parabolic along the length of the junction:

$$\rho_f(x) = \frac{Rx^2}{2w_f}.$$

The facets of M that depend on material selection versus design and operating choices can be made more explicit by disentangling these within R. Selecting a PCM fill $\phi = w_2/w_t$ (where total couple width $w_t = w_2$ neglects the oxide thickness) that minimizes R requires:

$$\phi_{min} = \frac{1}{1+\sqrt{1/\alpha}} \quad (10)$$

where $\alpha = \rho_2/\rho_1$. Then, $$\frac{R}{w_t}\Big|_{\phi_{min}} = R'_{min} = \sqrt{\rho_1\rho_2\left(2+\sqrt{\alpha}+\sqrt{1/\alpha}\right)} \quad (11)$$

For cobalt and gallium, α is 25/4, $\phi_{min}$ about 0.67, and is $R'_{min}$ is 55.5×10$^{-8}$Ω-m.

Material properties can be collected apart from geometry and driving current:

$$M = \frac{ST}{R'_{min}} \cdot \frac{w_t}{j_0 L^2} \quad (12)$$

Thus, influences on couple ideality become clearer. High power factor materials are preferred, as well as low aspect ($L/w_t$) couples and low driving current. As described below, these will be related to expected active Peltier (AP)-TES performance, as parameter choices that lead to idealistic behavior present a tradeoff versus those that lead to desired performance.

Cold start analysis. Using this solution as a design rule, the operating characteristics of an AP-TES can be estimated using a collection of assumptions that is termed here as a "cold start analysis." The central assumption is that of neglecting thermal conduction: heat generated within the couple at a location x is immediately available for phase change at that location, and no heat conducts along the x-direction. This is equivalent to setting $k_\perp = \infty$ and $k_\parallel = 0$ for all materials.

This is justified by the second assumption of uniform initial temperature just below the PCM melting point, and a third assumption of very high aspect ratio, $w_2/L$, for the PCM. Since all heat is immediately used to melt the PCM (uniformly), no temperature changes occur and thus no gradients develop to drive conduction. This also prevents the development of a Seebeck potential across the oxide film, an oppositional effect that is not treated in the analysis resulting in Equations (6-8).

Finally, it is assumed that the transported Peltier heat is sourced from an ideal cold junction with no losses, the design of which is overlooked in the cold start analysis. This cold junction draws heat from an external bath across an interface that is the same total width as the couple. This is precisely the storage power density associated with the AP-TES module, which is preferably maximized. It can be found by integrating $ST_{jf}(x)$ along the length of the hot junction:

$$\bar{q}'' = \frac{1}{w_t} \int_0^L ST j_f(x) dx = ST j_0 \frac{L}{w_t} \sqrt{\frac{M}{M+1}} \qquad (13)$$

This operates in tension with the phase change storage density. The storage capacity of the AP-TES must be discounted by the Joule losses experienced during operation. Formulating the capacity as an areal density (J/m²) available to the external bath along the cold-side interface results in:

$$\frac{H'}{w_t} = h_v L \phi \left( \frac{COP}{1 + COP} \right) = h_v L \phi \sqrt{\frac{M}{M+1}} \qquad (14)$$

where $h_v$ is ($\rho H_A$), the volumetric latent heat of the PCM and the coefficient of performance (COP) is the ratio of useful heat transport to work expended. COP can be calculated by integrating terms of Equation (3) along the hot junction, resulting in:

$$COP = M + \sqrt{M + M^2} \qquad (15)$$

Thus, design and operating parameters that promote high storage power density, $j_0$ and $1/w_t$, lead to reductions in COP and thus reductions in effective energy storage density. L is a positive factor in both metrics but has a quadratic contribution to M. Holding other parameters fixed, as $$M \to 0, F'(1) = \sqrt{\frac{M}{M+1}} \to \sqrt{M} \propto 1/L.$$

Thus for any configuration there is a useful upper limit to L, where diminishing returns set in as M and COP approach zero.

These COP dependencies cancel when computing the effective charging time:

$$t_c \approx \frac{H'}{w_t \bar{q}''} = \frac{h_v \phi w_t}{ST j_0} \qquad (16)$$

It may seem unintuitive that the charging time is unrelated to efficiency. That relation becomes clearer when examining the AP-TES module level operating parameters (vs the performance characteristics $\bar{q}''$, $H'/w_t$, and $t_c$). The input current to the couple (in units of A/m due to arbitrary depth "into the page") is:

$$I'_{in} = L j_0 \sqrt{\frac{M}{M+1}} \qquad (17)$$

Thus, the input current ranges from a maximum of $Lj_0$ to zero, since as M→0 the junction area that actually conducts current vanishes to zero.

The voltage across the couple is:

$$V_2 - V_1 = L^2 j_0 F(1) \left[ \frac{w_1}{\rho_1} + \frac{w_2}{\rho_2} \right] = ST \frac{F(1)}{M} \qquad (18)$$

which reduces to:

$$V_2 - V_1 = ST \left( \sqrt{\frac{M+1}{M}} - 1 \right) \qquad (19)$$

The total device power consumption (per unit depth into the page) is:

$$W' = N \cdot ST L j_0 \left( 1 - \sqrt{\frac{M}{M+1}} \right) \qquad (20)$$

where N is the number of couples connected in series.

Figure 3:
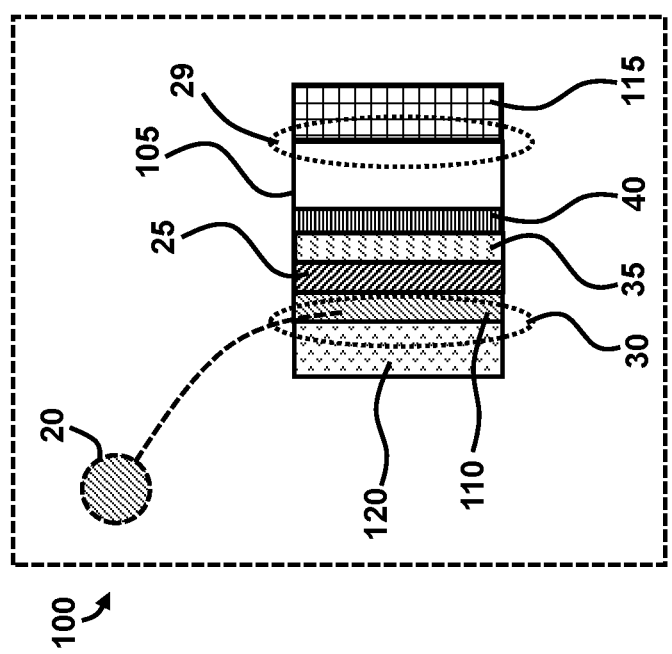
FIG. 3 is a block diagram illustrating a TES system, according to an embodiment herein.
Figure 4:
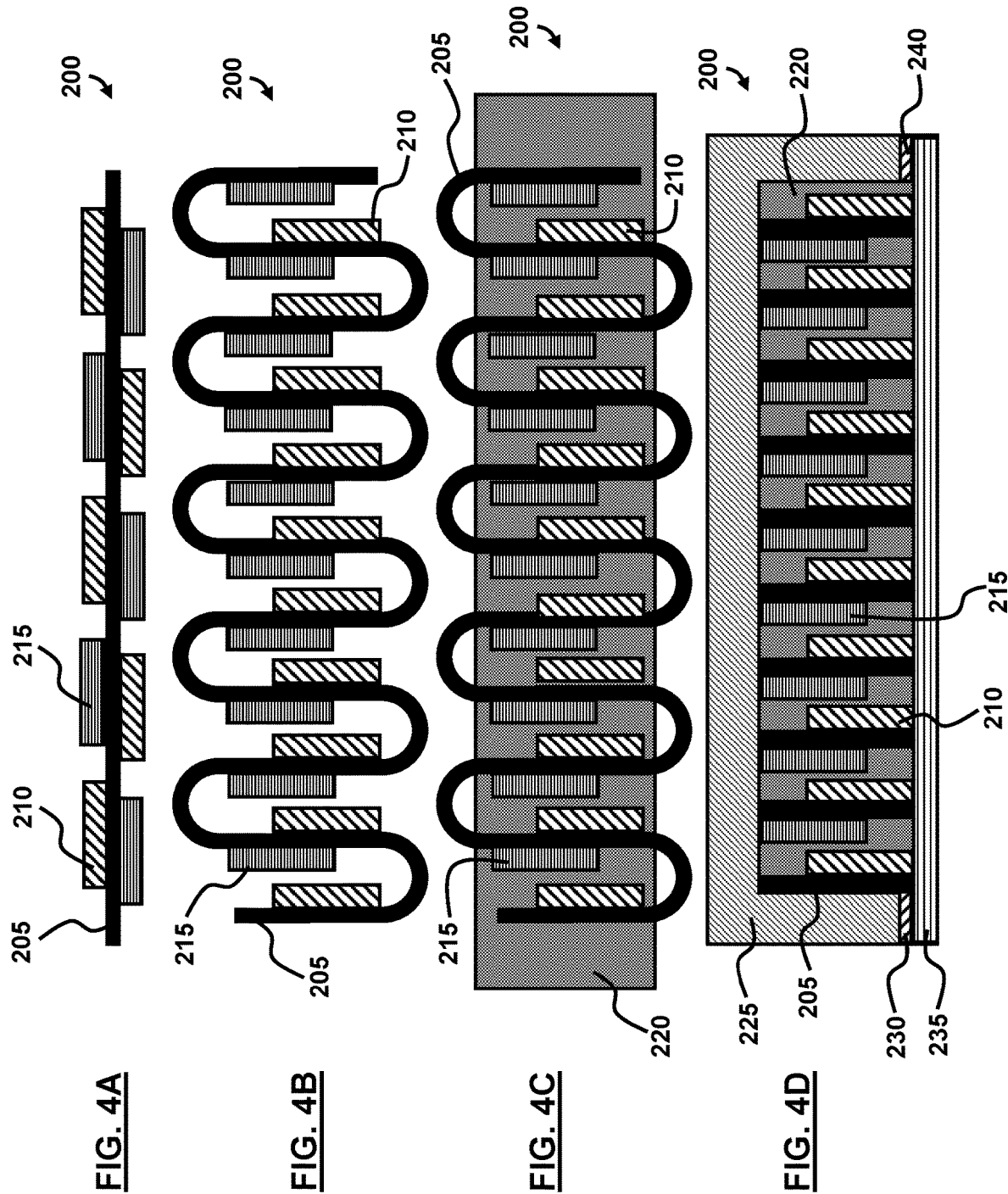
FIGS. 4A through 4D are sequential schematic diagrams illustrating the fabrication process flow for an AP-TES module, according to an embodiment herein.

FIG. 3, with reference to FIGS. 1 and 2, illustrates a TES system 100 comprising a Peltier device 105 comprising a cold side thermoelectric junction 29 that transports heat to a hot side thermoelectric junction 30; and a LMPM material 110 within the Peltier device 105. The LMPM material 110 is to (i) temporarily store transported heat in the hot side thermoelectric junction 30, and (ii) control a thermal release of the heat at a selected time. The thermoelectric effect of the LMPM material 110 is to transport heat in the Peltier device 105. In an example, the LMPM material 110 may comprise a metallic phase change material (PCM) 20. According to some examples, the LMPM material 110 may comprise any of gallium or its alloys, low temperature fusible alloys, and solid metal shape memory alloys.

The TES system 100 may comprise a graded oxide layer 25 adjacent to the LMPM material 110 to serve as a distributed electrical junction to create the hot side thermoelectric junction 30 in a bulk volume of the LMPM material 110. In an example, the graded oxide layer 25 may comprise α-IGZO. In an example, the TES system 100 may comprise a high-thermopower corrugated metal foil layer 35 comprising barrier oxides patterned therein. The high-thermopower corrugated metal foil layer 35 may be adjacent to the graded oxide layer 25. The TES system 100 may comprise a dielectric layer 40 adjacent to the high-thermopower corrugated metal foil layer 35. In an example, the high-thermopower corrugated metal foil layer 35 may comprise copper. In an example, the dielectric layer 40 may comprise SiN. The Peltier device 105 may comprise a baseplate 115 adjacent to the cold side thermoelectric junction 29. According to an example, the Peltier device 105 may comprise an insulation encapsulating layer 120 adjacent to the hot side thermoelectric junction 30. In an example, the insulation encapsulating layer 120 may comprise a ceramic material.

Phase change TES systems and the historic instantiations of TECs as heat pumps both have in common a lack of area advantage. They both transport heat from one plane to another; PCMs from a boundary to the phase front and TECs from the cold side to the hot side. The entire justification for using a TTPL as part of a TMS is to obtain an area advantage: the space-filling nature of surface enhancements (fins, etc.) in the condenser and evaporator efficiently couple an areal boundary to a volumetric system. Furthermore, the condenser can be sized independently of the evaporator, meaning further advantage can be obtained by oversizing the more remote component. Breaking the rigid semiconductor paradigm of TEC heat pumps by using metallic elements can be an opportunity to seize area advantage in this solid-state TPPL analogue. A thermal energy storage system is the perfect solution since only a single component must be designed (vs. the condenser/evaporator pair of a steady state TPPL).

FIGS. 4A through 4D, with reference to FIGS. 1 through 3, provides one such example of an active Peltier TES (AP-TES) module 200 that uses a single high thermopower metal in conjunction with a LMPM PCM. More particularly, FIGS. 4A-4D depict an example fabrication process flow for an AP-TES module 200 comprising a high-thermopower metal foil 205, with hot junction oxide 210 and cold junction oxide 215, a LMPM PCM 220, with an encapsulation layer 225, and traces 230, 235 (e.g., $V^{31}$, $V^+$). A baseplate 240 may also be provided. The metal foil 205 is patterned with barrier oxides 210, 215 before being corrugated to a predesigned form. The molten LMPM PCM 220 is infiltrated into the corrugations of the metal foil 205 and solidified. The resulting structure is then planarized, packaged, and encapsulated (e.g., with encapsulation layer 225) to create the finished AP-TES module 200. Example materials used for constructing the module 200 include cobalt as the n-type metal foil 205, and gallium ($T_m$: 29.7° C.) as the LMPM PCM 220. With no additional thermoelectric materials present, the gallium acts as the p-type leg, forming a series of thermocouple pairs with the cobalt in the finished module 200. The relevant thermal and electric properties of both metals and other materials used in in accordance with the embodiments herein are outlined in Table 1.

TABLE 1

Electric and Thermal Properties of Materials

| Material | S µV/K | ρ Ω-m | k W/m-K | $(\rho C_p)$ MJ/m$^3$-K | $(\rho H_A)$ MJ/m$^3$ |
|---|---|---|---|---|---|
| Co | −30 | 6 × 10$^{-8}$ | 100 | 3.71 | — |
| Ga (s) | −0.4 | 25 × 10$^{-8}$ | 40.6 | 2.19 | 481 |
| Ga (l) | | | 33 | 2.01 | |
| Cu | 17.7 | 1.7 × 10$^{-8}$ | 401 | 2.19 | — |
| SiN | 0 | 1 × 10$^{10}$ | 30 | 2.07 | — |
| α-IGZO | 0 | 5 × 10$^{(-4,1)}$ | 1 | 2.56 | — |

Figure 5:
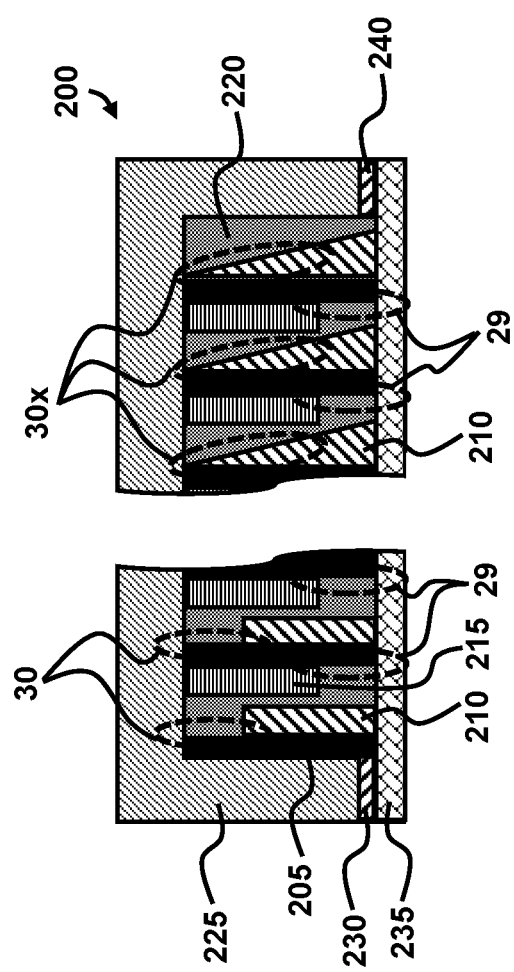
FIG. 5 is a schematic diagram illustrating the detail of notional thermoelectric junctions within an AP-TES module showing two styles of hot junctions (simple metal-metal junction (left) and distributed junctions (right)), according to an embodiment herein.

In FIG. 5, with reference to FIGS. 1 through 4D, with cobalt (metal foil 205) and gallium (LMPM PCM 220) as the active materials, when current flows from right-to-left the junctions 29 adjacent to the baseplate 235 absorb heat while the junctions 30 deep within the bulk of the module 200 reject heat. The left detail of the figure illustrates simple junctions at both the cold-side header 29 and within the bulk of the TES module 200 (hot-side 30). While such a configuration can effectively transport heat into the bulk of the TES module 200 without relying on thermal conduction, it does not truly alleviate the lack of area-to-volume coupling.

FIG. 5 also shows an alternative for the hot junction 30× comprising of an oxide layer 210 with graded resistance. While this is shown schematically as a gradation in oxide thickness, these distributed junctions 30× could be also realized with an oxide of graded resistivity. An example is α-IGZO, an oxide with tunable resistivity able to span five orders of magnitude depending on exposure to electron beam radiation. Such junctions 30× can thus be engineered to uniformly reject heat throughout the entire bulk of the TES module 200, realizing the goal of true area advantage.

Cold Junction Design—The cold start analysis idealizes the performance of this part of the AP-TES, and in order to preserve the anticipated behavior of the module losses at this location must be minimized. The embodiments herein mitigate the adverse effect of current crowding leading to high Joule losses.

In finite element (FE) models, current crowding at the 180° turns at the n-p junction led to the introduction of rounded oxide terminations, as diagrammed in FIG. 5. The terminations have radii ten times greater than the SiN oxide thickness spanning the remainder of the n-p interface (in the portions of the module 200 dedicated to the distributed hot-side junction 30×). The length of the remaining area for current flow is ten times greater than the termination radius, on the order of the width of the Co element, $w_1$. The graded α-IGZO oxide separating the gallium and cobalt is not implemented until three $w_f$-lengths from the SiN header oxide, allowing the current density to fully relax while transitioning from the cold junction to the distributed hot-junction region 30×.

Copper "pseudo-traces" 235, 240 may also be provided with the aim of further drawing current density deeper into the widths of the metal elements and away from area in the vicinity of the oxide termination. Since copper, at S=17.7 µV/K is more "p-type" than gallium, this has the interesting effect of creating an enhanced strength cold-junction 29 at the Co—Cu interface and a weak hot-junction 30 at the Cu—Ga interface. This points to a logical evolution of the AP-TES that might use Cu as the primary p-type element to form a Co—Ga—Cu "sandwich" and a doubly distributed hot junction 30×.

Finally, a copper thermal spreader (i.e., baseplate 235) is included underneath the thin SiN header oxide. This helps redistribute heat flowing from the boundary with the thermal bath, especially in the face of the competing junctions formed by the copper pseudo-traces 235, 240.

EXPERIMENT

Two size scales were simulated with two thermal boundary temperatures across four driving current densities. The two thermal boundaries were either a step increase in temperature from that of the initial temperature of 302.8 K, or maintaining that temperature and relying solely on Peltier transport to induce a heat flux. When a step increase was used, an additional simulation with no applied voltage was undertaken to assess passive performance under Fourier conduction only. The microscale case (referred to as "Base" in figures) uses L=10 µm and $w_f$=300 nm as the primary dimensions. Oxide layers are 10 nm thick, and the copper spreader on the underside is 100 nm thick. A mesoscale design case ("200×") scales up all lengths by a factor of 200, so that L=2 mm and $w_f$=60 µm.

Figure 6:
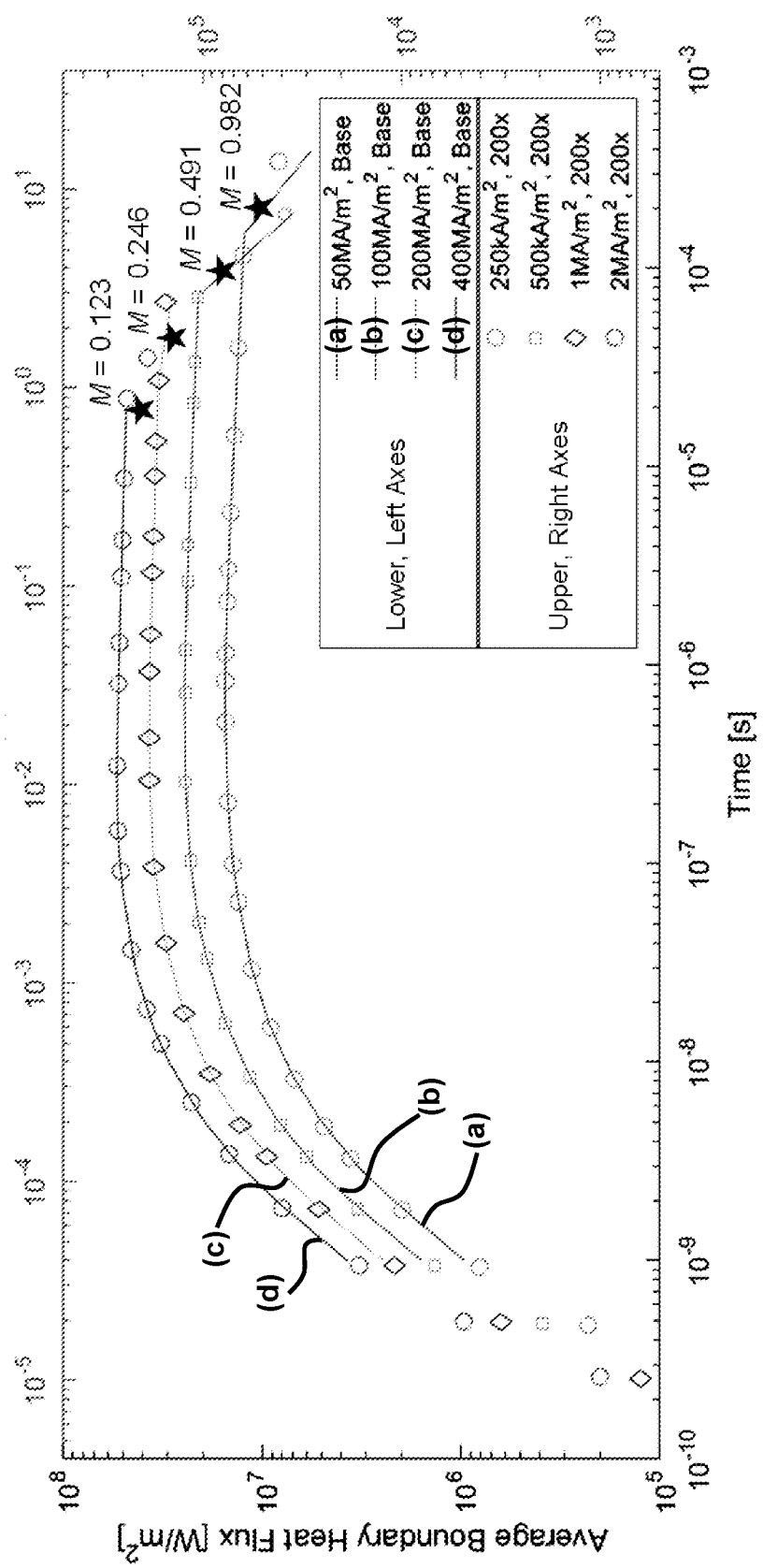
FIG. 6 is a graphical diagram illustrating heat flux that is induced when $T_{bd}=T_i$ where the transport occurs only as a result of the Peltier effect, according to an embodiment herein.

FIG. 6, with reference to FIGS. 1 through 5, shows the thermal response of both sizes of AP-TES unit cells under fixed boundary temperatures $T_{bd}=T_i$. Heat flows into the system across this boundary until the PCM is exhausted, temperatures rise to a steady state, and waste heat from joule losses is rejected back across the boundary. Plotted are the data up until this reversal to a negative heat flux (when in a practical application the current would be switched off). Dual axes are used to demonstrate that the basic scaling Equations (13-16) of the cold start analysis do an excellent job of capturing the effects of changing length scales. In increasing length scales by 200, heat flux is reduced by 200, while time scales increased by $(200)^2$. To show single-point prediction of Equations (13) and (16), four filled reference points are included in FIG. 6, corresponding to each of the M values simulated. The effective charging times, $t_c$, are very well predicted.

Figure 7:
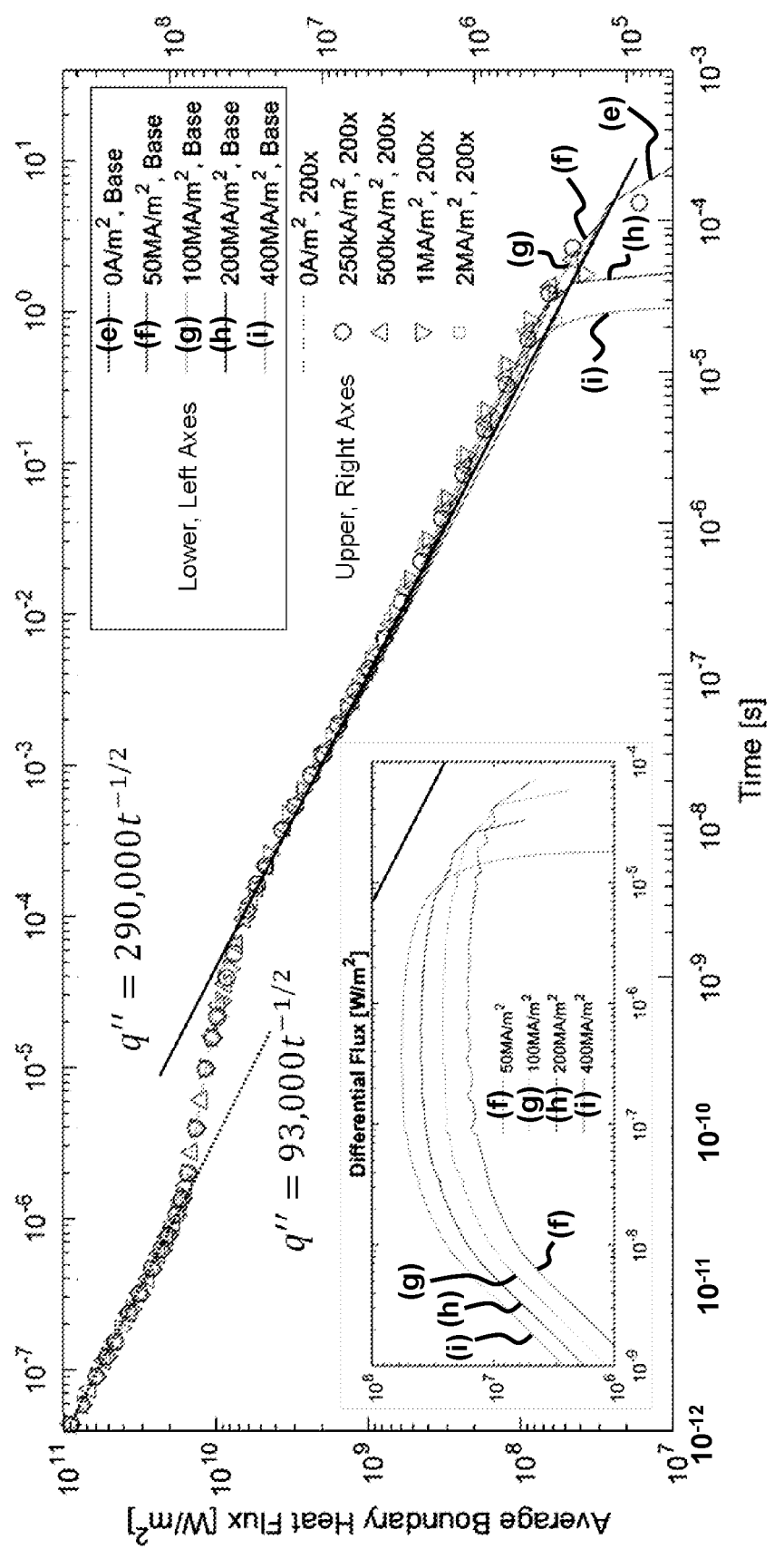
FIG. 7 is a graphical diagram illustrating heat flux that is induced by a 2 K step increase in boundary temperature where a power law fit of the passive performance is shown to agree well with semi-infinite 1D conduction, according to an embodiment herein.

FIG. 7, with reference to FIGS. 1 through 6, plots the same boundary fluxes when the boundary temperature undergoes a step change of 2 K. Again, dual axes are used to compare the performance of the two size/time scales. The first observation is that even at this modest temperature differential, the majority of the thermal transport is due to conduction. Two power law curve fits are superimposed on the data, showing the $t^{-1/2}$ characteristic of semi-infinite planar conduction. At small times, the data furnished by the 200× system show the storage ability of the copper spreader. After a transition period where the melt front develops, a new characteristic is established with a ~3× higher heat flux vs. time relationship. Beyond 0.1 ms (for the small size scale), the off-state reference case begins to decline from this new characteristic, as by this point the heat has reached the far boundary and the semi-infinite relations no longer hold.

The inset of FIG. 7 details the additional flux transported across the boundary by powering the AP-TES (using only the small size scale data), obtained by an interpolated subtraction of the off-state simulation data. Included is the $q''=290,000\ t^{-1/2}$ fit to the off-state data in the upper right corner of the inset for context. From the plot one can see the Peltier transport contributes an extra 30-40% storage flux right as the PCM is about to be exhausted, when the relatively constant Peltier transport and decaying conduction transport are at their most comparable. If the boundary temperature step was of a larger magnitude, the Peltier contribution would be less of the total share.

An example point of application is to temporarily store heat generated as a by-product of operation of electronic devices, maintaining a desired operating temperature until the PCM 20 in the TES system 100 is exhausted. This version of TES system 100 is unique in that it can be actively driven in advance of device operation (anticipatory control) and does not require a temperature rise to drive heat transfer (e.g., managed device can be kept isothermal between on and off states). Moreover, the driving current of the thermoelectric TES system 100 can be one and the same as that powering the underlying electronic device, thereby simplifying system design.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. A thermal energy storage (TES) system comprising:
   a Peltier device comprising a cold side thermoelectric junction that transports heat to a hot side thermoelectric junction;
   a metallic phase change material (PCM) within the Peltier device, wherein the PCM is to (i) temporarily store transported heat in the hot side thermoelectric junction, and (ii) control a thermal release of the heat at a selected time; and
   a graded oxide layer spatially graded in electrical resistivity adjacent to the PCM to serve as a distributed electrical junction of the Peltier device to create the hot side thermoelectric junction in a bulk volume of the PCM.

2. The TES system of claim 1, wherein a thermoelectric effect of the PCM material is to transport heat in the Peltier device.

3. The TES system of claim 1, wherein the graded oxide layer comprises α-IGZO.

4. The TES system of claim 1, comprising a corrugated metal foil layer comprising barrier oxides patterned therein, wherein the corrugated metal foil layer is adjacent to the graded oxide layer.

5. The TES system of claim 4, comprising a dielectric layer adjacent to the corrugated metal foil layer comprising the barrier oxides patterned therein, wherein the |S| value of the corrugated metal foil layer is >10 uV/K and the corrugated metal foil layer is adjacent to the graded oxide layer.

6. The TES system of claim 4, wherein the high thermopower corrugated metal foil layer comprises copper.

7. The TES system of claim 5, wherein the dielectric layer comprises SiN.

8. The TES system of claim 1, wherein the Peltier device comprises a baseplate adjacent to the cold side thermoelectric junction.

* * * * *